United States Patent
Tapily

(10) Patent No.: US 10,115,601 B2
(45) Date of Patent: Oct. 30, 2018

(54) SELECTIVE FILM FORMATION FOR RAISED AND RECESSED FEATURES USING DEPOSITION AND ETCHING PROCESSES

(71) Applicant: Tokyo Electron Limited, Minato-ku, Tokyo (JP)

(72) Inventor: Kandabara N. Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/422,128

(22) Filed: Feb. 1, 2017

(65) Prior Publication Data

US 2017/0221718 A1 Aug. 3, 2017

Related U.S. Application Data

(60) Provisional application No. 62/290,453, filed on Feb. 3, 2016.

(51) Int. Cl.
*H01L 21/308* (2006.01)
*H01L 21/3065* (2006.01)
(Continued)

(52) U.S. Cl.
CPC ...... *H01L 21/3085* (2013.01); *H01L 21/0228* (2013.01); *H01L 21/02178* (2013.01);
(Continued)

(58) Field of Classification Search
None
See application file for complete search history.

(56) References Cited

U.S. PATENT DOCUMENTS 6,180,490 B1 * 1/2001 Vassiliev ........... H01L 21/76232
257/E21.549
6,596,654 B1 * 7/2003 Baynnan ............... C23C 16/045
257/E21.268
(Continued)

FOREIGN PATENT DOCUMENTS

JP 2008198996 A 8/2008
JP 2009531535 A 9/2009
(Continued)

OTHER PUBLICATIONS

Japan Patent Office, Office Action for japanese patent application No. 2017-017740, dated Feb. 6, 2018, 3pages.
(Continued)

*Primary Examiner* — Allan Olsen

(57) ABSTRACT

Embodiments of the invention provide a processing method for selective film formation for raised and recessed features using deposition and etching processes. According to one embodiment, the method includes providing a substrate having a recessed feature with a sidewall and a bottom portion, and depositing a film in the recessed feature and on a field area around the opening of the recessed feature, where the film is non-conformally deposited with a greater film thickness on the bottom portion than on the sidewall and the field area. The method further includes etching the film in an atomic layer etching (ALE) process in the absence of a plasma, where the etching thins the film on the bottom portion and removes the film from the sidewall and the field area, and repeating the depositing and the etching at least once to increase the film thickness of on the bottom portion.

20 Claims, 9 Drawing Sheets

(51) Int. Cl.
*H01L 29/06* (2006.01)
*H01L 21/02* (2006.01)

(52) U.S. Cl.
CPC .... *H01L 21/02274* (2013.01); *H01L 21/3065* (2013.01); *H01L 21/3081* (2013.01); *H01L 29/0657* (2013.01)

(56) References Cited

U.S. PATENT DOCUMENTS

| | | | | |
|---|---|---|---|---|
| 6,867,086 | B1* | 3/2005 | Chen | C23C 16/045 |
| | | | | 257/E21.252 |
| 7,541,297 | B2* | 6/2009 | Mallick | C23C 16/045 |
| | | | | 257/E21.279 |
| 7,803,722 | B2* | 9/2010 | Liang | C23C 16/34 |
| | | | | 257/E21.487 |
| 7,902,080 | B2* | 3/2011 | Chen | C23C 16/045 |
| | | | | 216/80 |
| 8,025,922 | B2* | 9/2011 | Haukka | C23C 16/0218 |
| | | | | 427/248.1 |
| 8,133,779 | B2 | 3/2012 | Ohtsuka | |
| 8,232,176 | B2* | 7/2012 | Lubomirsky | H01L 21/76229 |
| | | | | 257/E21.279 |
| 9,230,800 | B2* | 1/2016 | LaVoie | C23C 16/045 |
| 9,570,274 | B2* | 2/2017 | Swanninathan | C23C 16/045 |
| 9,627,221 | B1* | 4/2017 | Zaitsu | H01L 21/31116 |
| 9,837,312 | B1* | 12/2017 | Tan | H01L 21/76879 |
| 9,984,940 | B1* | 5/2018 | Chu | H01L 21/845 |
| 2007/0281448 | A1 | 12/2007 | Chen et al. | |
| 2007/0281495 | A1* | 12/2007 | Mallick | C23C 16/045 |
| | | | | 438/778 |
| 2007/0287254 | A1* | 12/2007 | Natori | H01L 27/115 |
| | | | | 438/264 |
| 2008/0169534 | A1 | 7/2008 | Dip et al. | |
| 2009/0304924 | A1 | 12/2009 | Gadgil | |
| 2012/0267341 | A1 | 10/2012 | Kato et al. | |
| 2015/0380281 | A1 | 12/2015 | Sriraman et al. | |
| 2015/0380302 | A1* | 12/2015 | Mountsier | H01L 21/76831 |
| | | | | 438/654 |
| 2016/0203995 | A1* | 7/2016 | Kanarik | H01L 21/0228 |
| | | | | 438/703 |
| 2016/0293398 | A1* | 10/2016 | Danek | H01L 21/0228 |
| 2016/0343612 | A1* | 11/2016 | Wang | H01L 21/76862 |
| 2017/0040214 | A1* | 2/2017 | Lai | H01L 21/32136 |
| 2017/0229314 | A1* | 8/2017 | Tan | H01L 21/30655 |
| 2017/0365478 | A1* | 12/2017 | George | H01L 21/28185 |
| 2018/0033635 | A1* | 2/2018 | Kanarik | H01L 21/30655 |
| 2018/0061628 | A1* | 3/2018 | Ou | H01L 21/0228 |
| 2018/0061663 | A1* | 3/2018 | Chandrashekar | C23C 16/505 |
| 2018/0166255 | A1* | 6/2018 | Blomberg | H01J 37/32009 |

FOREIGN PATENT DOCUMENTS

| | | |
|---|---|---|
| JP | 2009539266 A | 11/2009 |
| JP | 2012209394 A | 10/2012 |
| KR | 2009-0018865 A | 2/2009 |
| KR | 2009-0031496 A | 3/2009 |
| KR | 2012-0112116 A | 10/2012 |

OTHER PUBLICATIONS

Korean Intellectual Property Office, Office Action for korean patent application No. 10-2017-0015547, dated May 4, 2018, 11 pages.

* cited by examiner

SELECTIVE FILM FORMATION FOR RAISED AND RECESSED FEATURES USING DEPOSITION AND ETCHING PROCESSES

CROSS-REFERENCE TO RELATED APPLICATIONS

This application is related to and claims priority to U.S. Provisional application Ser. No. 62/290,453 filed on Feb. 3, 2016, the entire contents of which are herein incorporated by reference.

FIELD OF INVENTION

Present invention relates to the field of semiconductor manufacturing and semiconductor devices, and more particularly, to a method of selective film formation for raised and recessed features using deposition and etching processes.

BACKGROUND OF THE INVENTION

As smaller transistors are manufactured, the critical dimension (CD) or resolution of patterned features is becoming more challenging to produce. Self-aligned patterning needs to replace overlay-driven patterning so that cost-effective scaling can continue even after extreme ultraviolet (EUV) introduction. Patterning options that enable reduced variability, extend scaling and enhanced CD and process control are needed. Selective formation of thin films is a key step in patterning of highly scaled technology nodes.

SUMMARY OF THE INVENTION

According to one embodiment, the method includes providing a substrate having a recessed feature with a sidewall and a bottom portion, and depositing a film in the recessed feature and on a field area around the opening of the recessed feature, where the film is non-conformally deposited with a greater film thickness on the bottom portion than on the sidewall and the field area. The method further includes etching the film in an atomic layer etching (ALE) process in the absence of a plasma, where the etching thins the film on the bottom portion and removes the film from the sidewall and the field area, and repeating the depositing and the etching at least once to increase the film thickness on the bottom portion.

According to another embodiment, the method includes providing a substrate containing raised features, each of the raised features having a sidewall and a top portion, and depositing a film on the raised features and on an area between the raised features, where the film is non-conformally deposited with a greater film thickness on the top portion than on the sidewall and the area between the raised features. The method further includes etching the film in an ALE process in the absence of a plasma, where the etching thins the film on the top portion and removes the film from the sidewall and the area between the raised features, and repeating the depositing and the etching at least once to increase the film thickness on the top portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1:
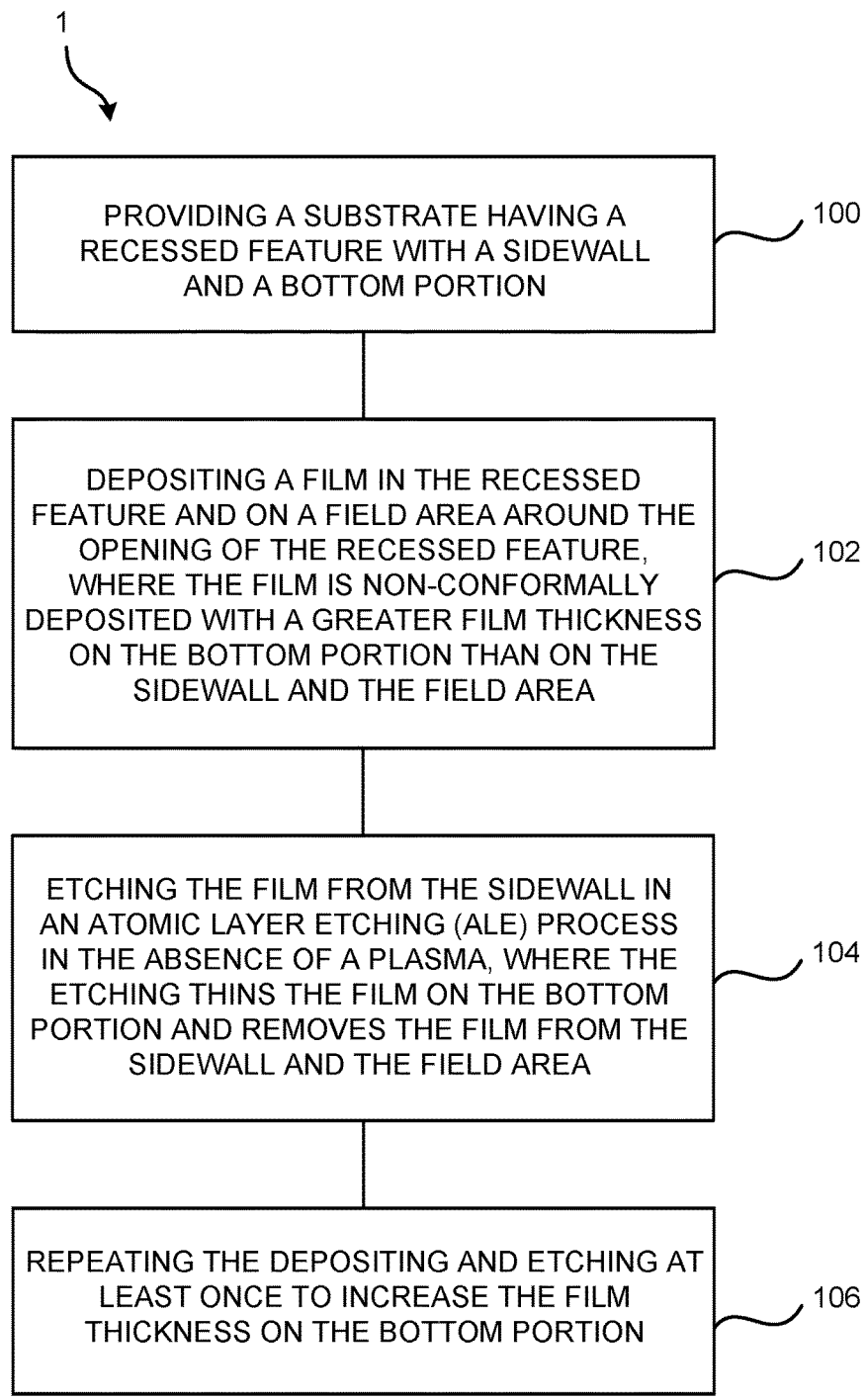
FIG. 1 is a process flow diagram for processing a substrate according to an embodiment of the invention.

FIG. 1 is a process flow diagram for processing a substrate according to an embodiment of the invention, and FIGS. 2A-2H schematically show through cross-sectional views a method of processing a substrate according to an embodiment of the invention. The process flow 1 includes, in 100, providing a substrate 200 having a recessed feature 204 with a sidewall 201 and a bottom portion 203. The recessed feature 204 is formed in a first layer 206 and the bottom portion 203 includes a surface of a second layer 202. The recessed feature 204 can, for example, have a width 207 that is less than 200 nm, less than 100 nm, less than 50 nm, less than 25 nm, less than 20 nm, or less than 10 nm. In other examples, the recessed feature 204 can have a width 207 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a critical dimension (CD). The recessed feature 204 can, for example, have a depth of 25 nm, 50 nm, 100 nm, 200 nm, or greater than 200 nm.

According to one embodiment, the first layer 206 and the second layer 202 may contain the same material, and therefore the bottom portion 203 and the sidewall 201 may contain the same material. For example, the material may be selected from the group consisting of silicon, germanium, silicon germanium, a dielectric material, a metal, and a metal-containing material. The dielectric material may be selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing materials may be selected from the group consisting of Cu, Al, Ta, Ru, TaN, TaC, and TaCN.

According to another embodiment, the first layer 206 and the second layer 202 may contain different materials, and therefore the bottom portion 203 and the sidewall 201 may contain different materials. The different materials may be selected from the group consisting of silicon, germanium, silicon germanium, a dielectric material, a metal, and a metal-containing material. The dielectric material may be selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing materials may be selected from the group consisting of Cu, Al, Ta, Ru, TaN, TaC, and TaCN.

The recessed feature 204 may be formed using well-known lithography and etching processes. Although not shown in FIG. 2A, a patterned mask layer may be present on the field area 211 and defining the opening of the recessed feature 204.

Figure 2A:
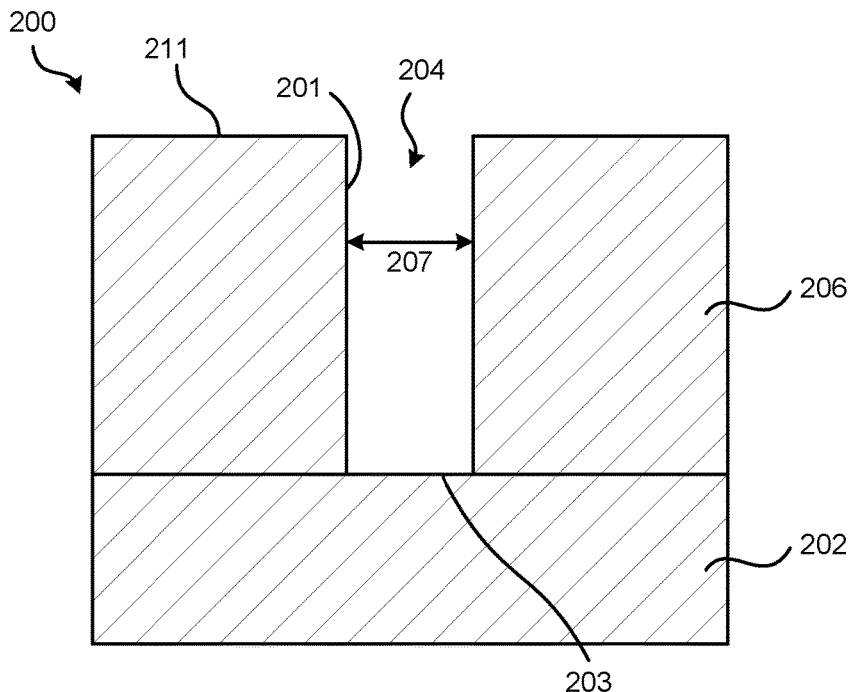
FIGS. 2A-2H schematically show through cross-sectional views a method of processing a substrate according to an embodiment of the invention.
Figure 2B:
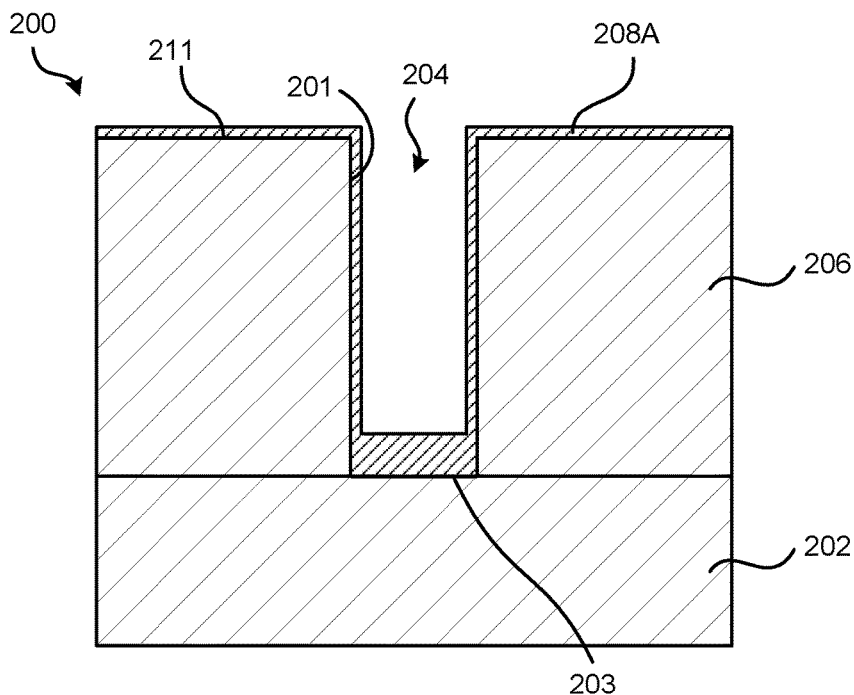

The process flow 1 further includes, in 102, depositing a film 208A in the recessed feature 204 and on a field area 211 around the opening of the recessed feature 204, where the film 208A is non-conformally deposited with a greater film thickness on the bottom portion 203 than on the sidewall 201 and the field area 211. This is schematically shown in FIG. 2B. According to some embodiments, the film 208 may be deposited by chemical vapor deposition (CVD) or microwave-assisted CVD. In some examples, the non-conformal deposition may be achieved due to different film nucleation rates on different materials. For example, nucleation of metal oxides proceed faster on dielectric materials than on metals (e.g., Cu metal), thereby resulting in greater film thickness. In one example, the film 208A may be selected from the group consisting of a dielectric material, a metal, and a metal-containing material. For example, the material of the film 208A may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. According to another embodiment, the film 208A may be selected from the group consisting of a metal oxide film, a metal nitride film, a metal oxynitride film, a metal silicate film, and a combination thereof. For example, the metal and the metal-containing material may be selected from the group consisting of Cu, Al, Ta, Ru, TaN, TaC, and TaCN.

In some examples, a thickness of the film 208A on the bottom portion 203 or on the sidewall 201 and on the field area 211 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm.

Figure 2C:
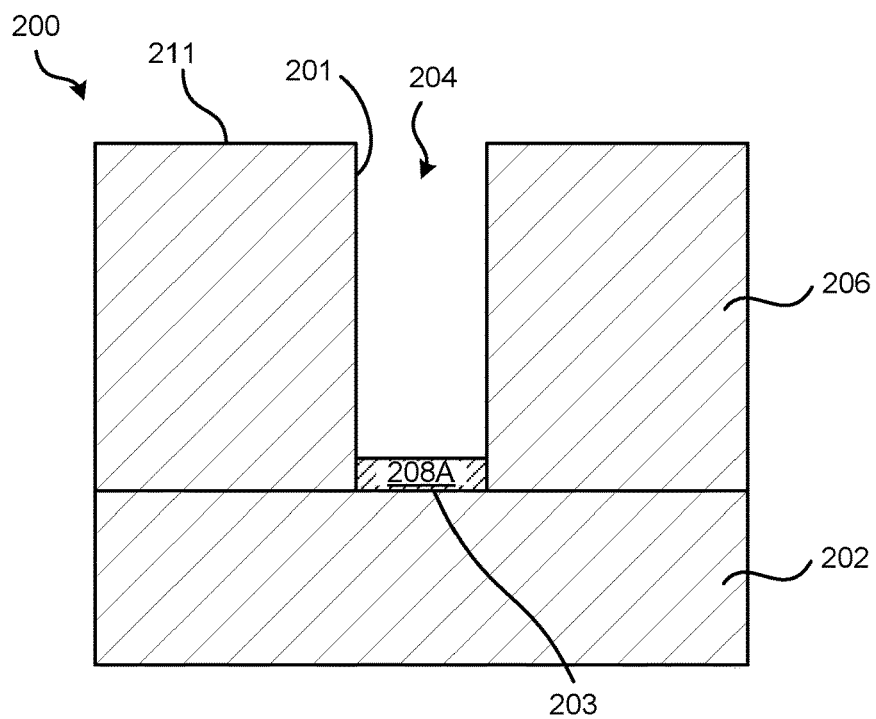

The process flow 1 further includes, in 104, etching the film 208A in an ALE process in the absence of a plasma, where the etching thins the film 208A on the bottom portion 203 and removes the film 208A from the sidewall 201 and the field area 211. This is schematically shown in FIG. 2C. According to some embodiments, it is not required that the film 208A be completely removed from the sidewall 201 and the field area 211. For example, only a portion of the film 208A on the sidewall 201 and/or the field area 211 may be removed by the ALE process.

ALE is a technique for removing thin layers of material using sequential reaction steps that are self-limiting. The basic ALE concept starts with a modification step that includes gas exposure to form a reactive layer, followed by a removal step to take off only this modified layer. Embodiments of the invention utilize ALE in the absence of a plasma, in order to achieve isotropic removal of material. According to one embodiment of the invention, the film 208A may contain $Al_2O_3$ (or another metal oxide) and the ALE process may include sequential gas exposures of trimethylaluminum (TMA) and HF.

Figure 2D:
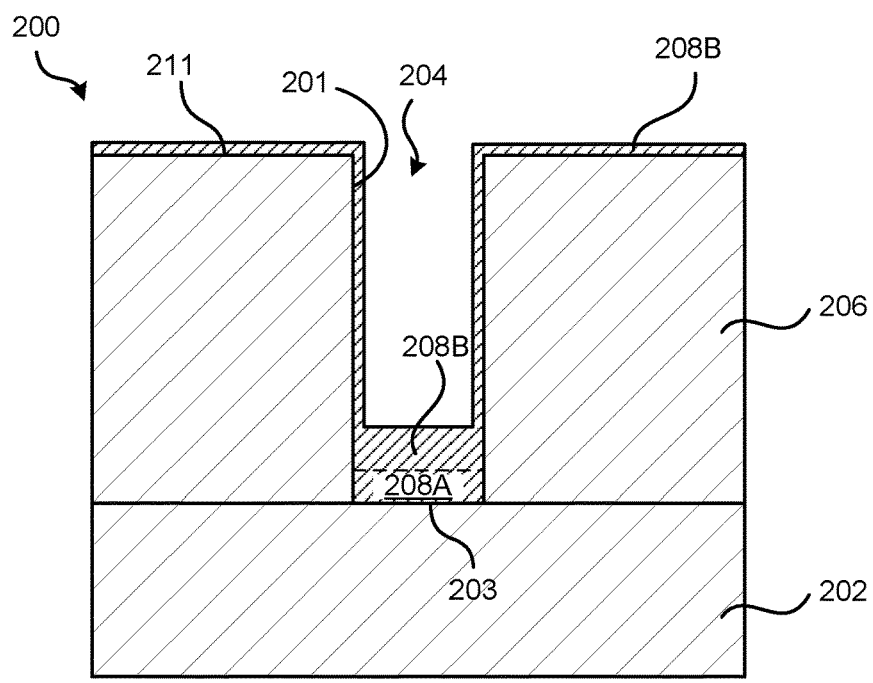
Figure 2E:
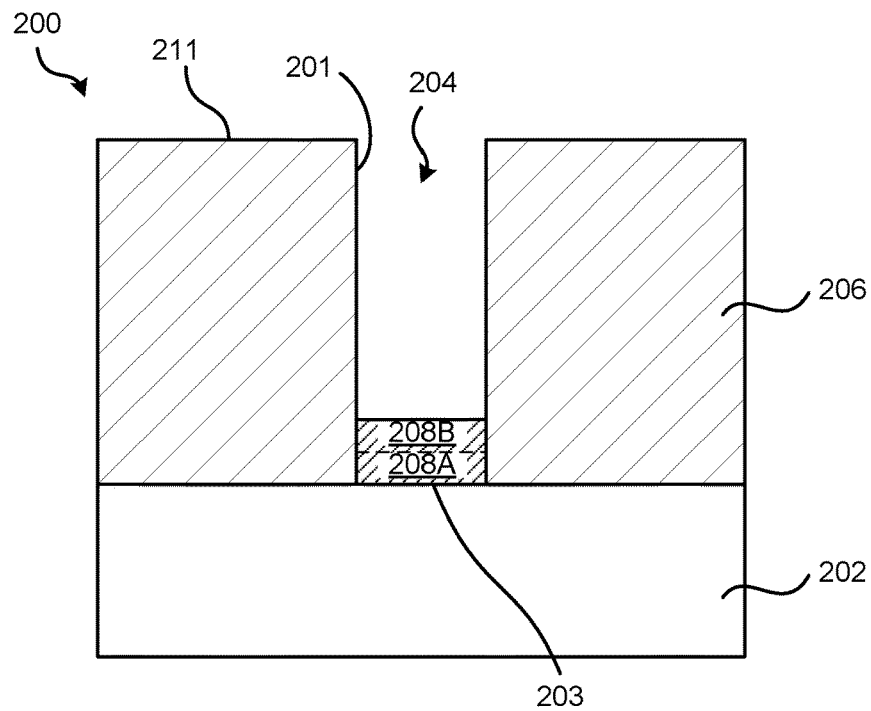
Figure 2F:
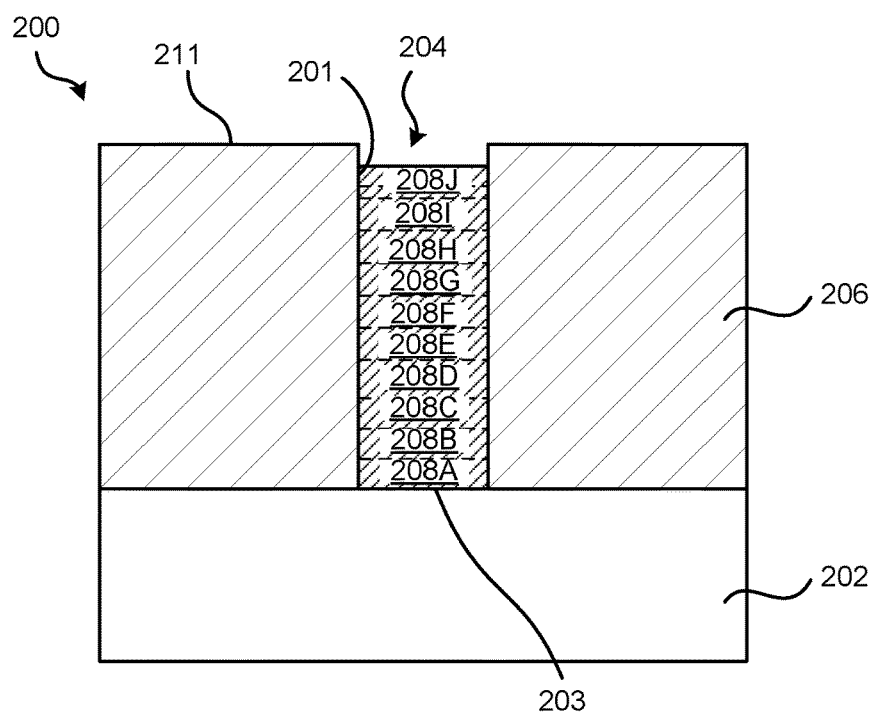
Figure 2G:
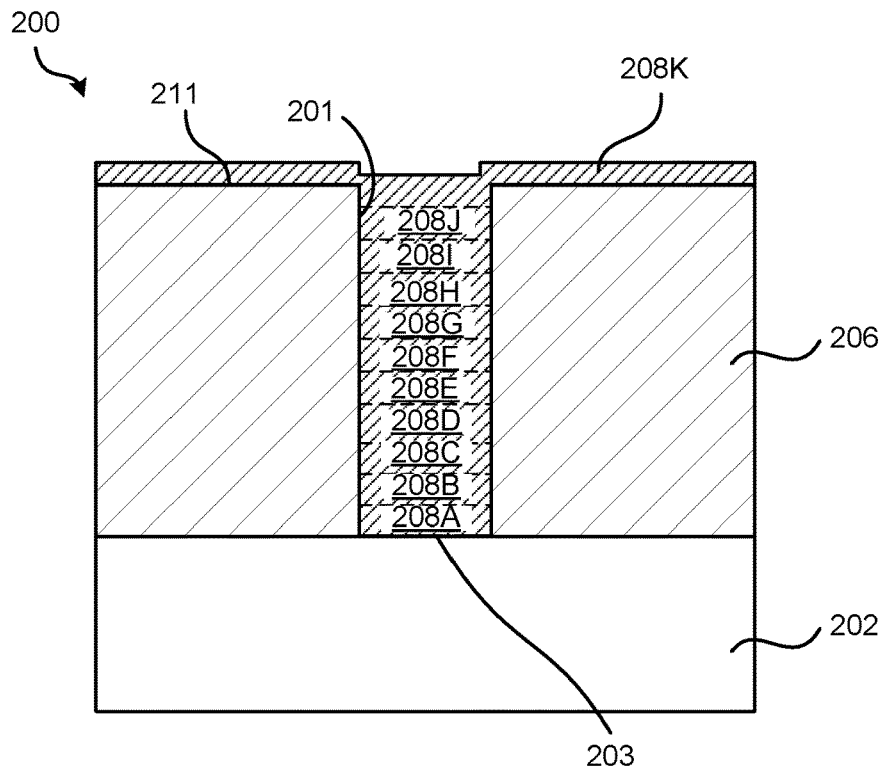
Figure 2H:
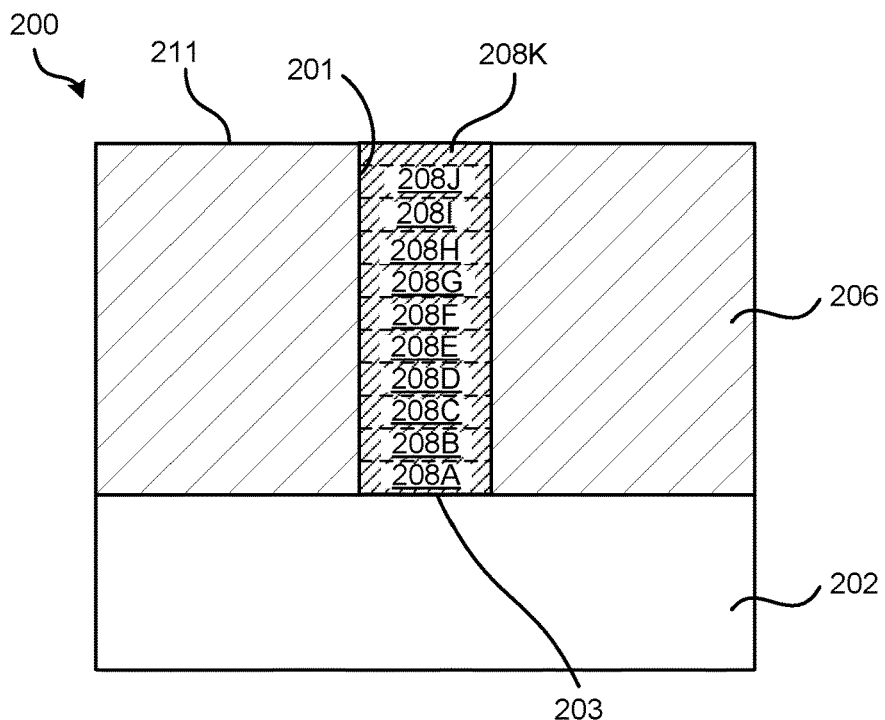

The process flow 1 further includes, in 106, repeating the depositing and the etching at least once to increase the film thickness on the bottom portion 203. FIG. 2D schematically shows a film 208B deposited on the film 208A, and FIG. 2E schematically shows the substrate 200 after etching the film 208B from the sidewall 201 and the field area 211. FIG. 2F schematically shows the substrate 200 after further repeating the depositing and etching steps. The substrate 200 contains films 208A-208J which nearly fill the recessed feature 204. In general, the number of films required to nearly fill the recessed feature 204 depends on the depth of the recessed feature 204, the thickness of the deposited film in each deposition cycle, and the amount of etching in each ALE cycle. In one example, shown in FIGS. 2G and 2H, the recessed feature 204 may be completely filled by overfilling with film 208K and, thereafter, planarizing the substrate 200 by removing excess film 208K. According to one embodiment, the planarizing may be performed using chemical mechanical polishing (CMP).

Figure 3:
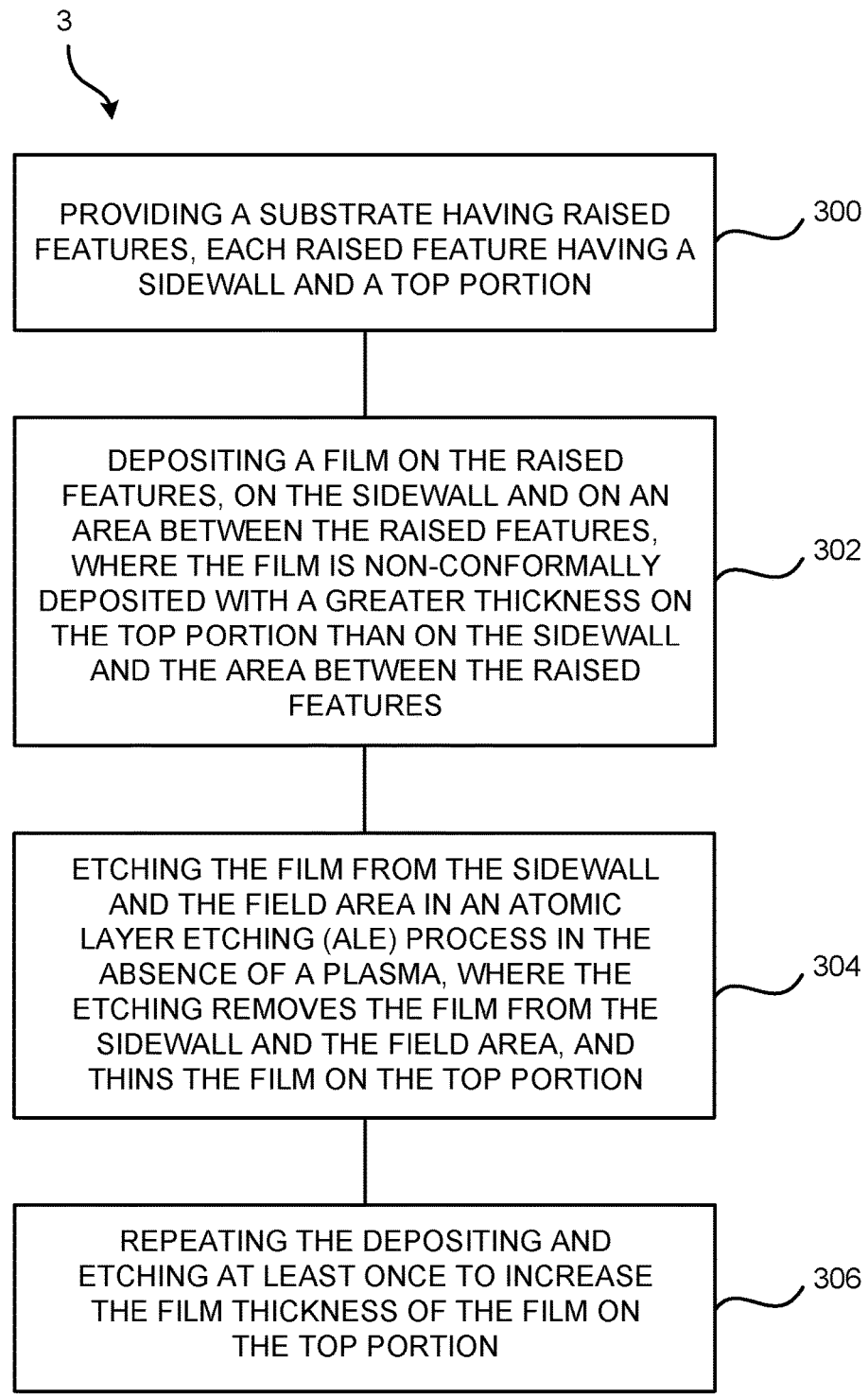
FIG. 3 is process flow diagram for processing a substrate according to an embodiment of the invention.

FIG. 3 is process flow diagram for processing a substrate according to an embodiment of the invention, and FIGS. 4A-4E schematically show through cross-sectional views a method of processing a substrate according to an embodiment of the invention.

The process flow 3 includes, in 300, providing a substrate 400 containing raised features 402 on a base layer 406, each of the raised features 402 having a sidewall 401 and a top portion 411. The substrate 400 further contains a recessed feature 404 and an area 403 between the raised features 402.

The raised features 402 can, for example, have a height 409 that is greater than 20 nm, greater than 50 nm, greater than 100 nm, or greater than 200 nm. The width 407 of the recessed feature 404 can be less than 200 nm, less than 100 nm, less than 50 nm, less than 25 nm, less than 20 nm, or less than 10 nm. In other examples, the recessed feature 404 can have a width 407 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The recessed feature 404 can, for example, have a depth of 25 nm, 50 nm, 100 nm, 200 nm, or greater than 200 nm.

According to one embodiment, the raised features 402 and the base layer 406 may contain the same material, and therefore the area 403 between the raised features 402 and the sidewall 401 may contain the same material. For example, the material may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing materials may be selected from the group consisting of Cu, Al, Ta, Ru, TaN, TaC, and TaCN.

According to another embodiment, the raised features 402 and the base layer 406 may contain different materials, and therefore the area 403 between the raised features 402 and the sidewall 401 may contain different materials. The different materials may be selected from the group consisting of silicon, germanium, silicon germanium, a dielectric material, a metal, and a metal-containing material. The dielectric material may be selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing materials may be selected from the group consisting of Cu, Al, Ta, Ru, TaN, TaC, and TaCN.

The raised features 402 may be formed using well-known lithography and etching processes. Although not shown in FIG. 4A, a patterned mask layer may be present on the top portion 411 and defining the opening of the recessed feature 404.

Figure 4A:
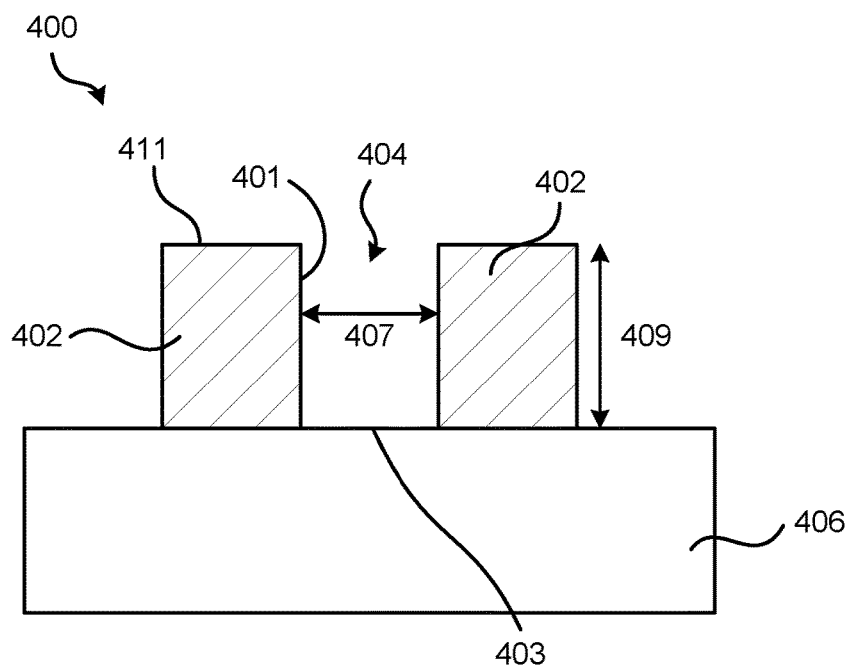
FIGS. 4A-4E schematically show through cross-sectional views a method of processing a substrate according to an embodiment of the invention.
Figure 4B:
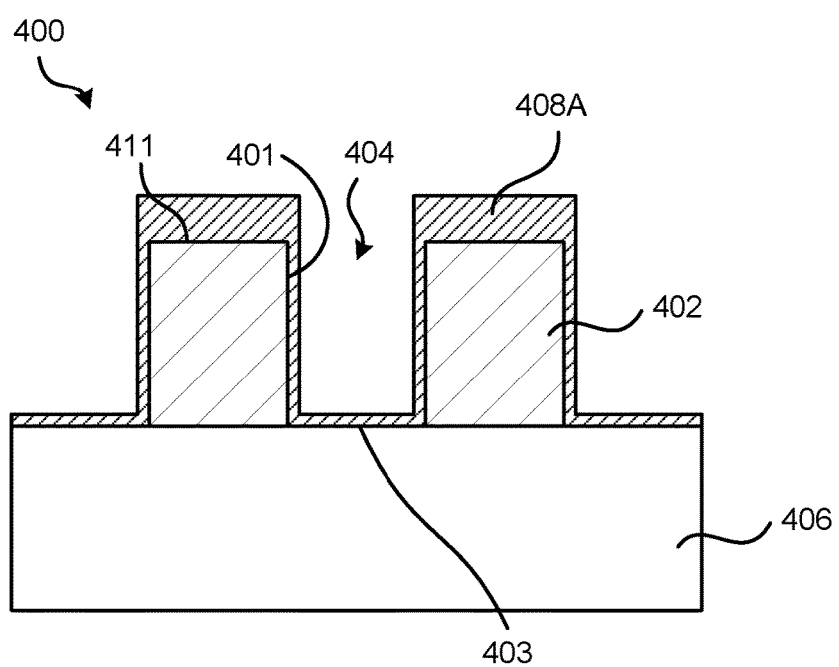

The process flow 1 further includes, in 302, depositing a film 408 on the raised features 402 and on the area 403 between the raised features 402, where the film 408 is non-conformally deposited with a greater film thickness on the top portion 411 than on the sidewall 401 and the area 403 between the raised features 402. This is schematically shown in FIG. 4B. According to some embodiments, the film 408 may be deposited by CVD or atomic layer deposition (ALD). In one embodiment, the film 408 may be deposited by plasma-enhanced CVD (PECVD), where non-conformal deposition may be achieved since the plasma density is greater near the top portion 411 than on the sidewall 401 and the area 403.

In one example, the film 408A may be selected from the group consisting of a dielectric material, a metal, and a metal-containing material. For example, the material of the film 408A may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. According to another embodiment, the film 408A may be selected from the group consisting of a metal oxide film, a metal nitride film, a metal oxynitride film, a metal silicate film, and a combination thereof. For example, the metal and the metal-containing materials may be selected from the group consisting of Cu, Al, Ta, Ru, TaN, TaC, and TaCN.

In some examples, a thickness of the film 408A on the top portion 411 or on the sidewall 401 and on the area 403 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm.

Figure 4C:
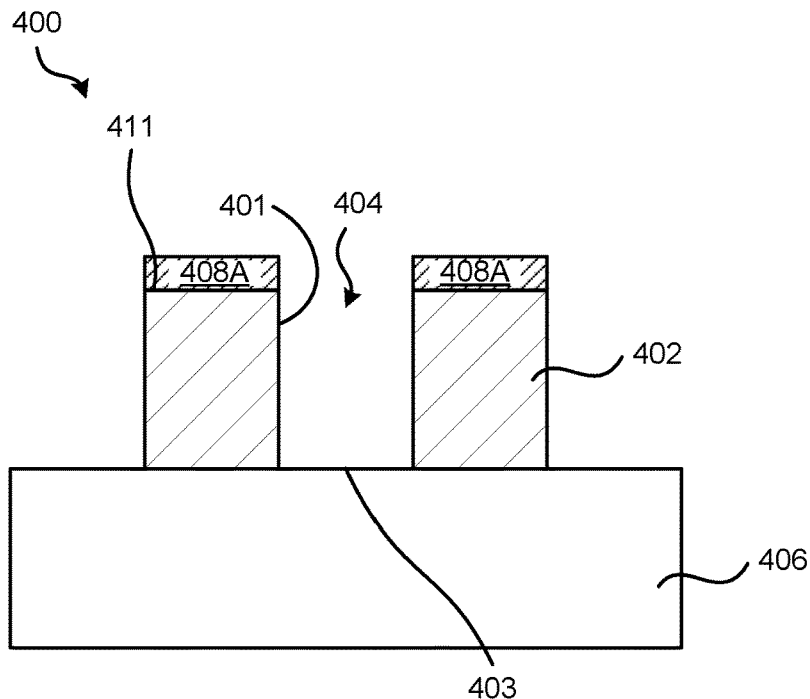

The process flow 300 further includes, in 304, etching the film 408A in an ALE process in the absence of a plasma, where the etching thins the film 408A on the top portion 411 and removes the film 408A from the sidewall 401 and the area 403 between the raised features 402. This is schematically shown in FIG. 4C. According to some embodiments, it is not required that the film 408A be completely removed from the sidewall 401 and the area 403. For example, only a portion of the film 408A on the sidewall 401 and/or the area 403 may be removed by the ALE process.

Figure 4D:
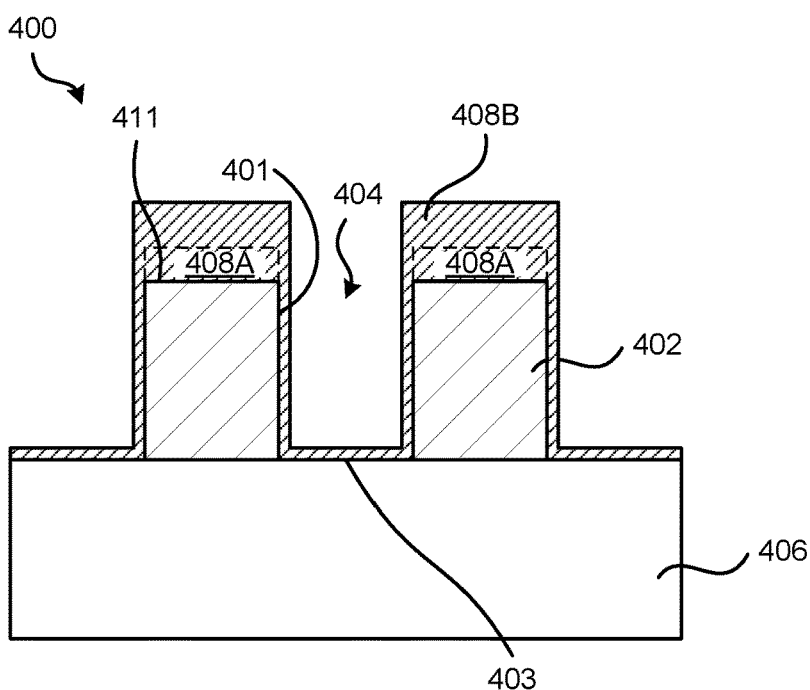
Figure 4E:
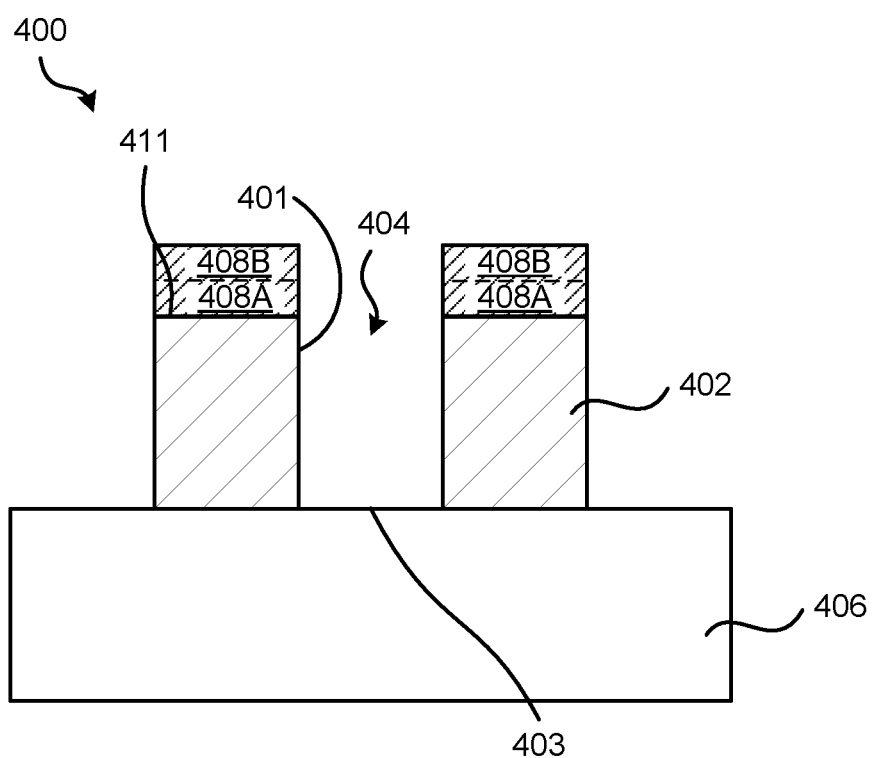

The process flow 3 further includes, in 306, repeating the depositing and the etching at least once to increase the film thickness on the top portion 411. FIG. 4D schematically shows a film 408B deposited on the film 408A, and FIG. 4E schematically shows the substrate 400 after etching the film 408B from the sidewall 401 and area 403 in an ALE process. The depositing and etching may be repeated to further increase the film thickness on the top portion 411.

A plurality of embodiments for method of selective film formation for raised and recessed features using deposition and etching processes have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A substrate processing method, comprising:
   providing a substrate having a recessed feature with a sidewall and a bottom portion;
   depositing a film in the recessed feature and on a field area around the opening of the recessed feature, wherein the film is non-conformally deposited with a greater film thickness on the bottom portion than on the sidewall and the field area;
   etching the film in an atomic layer etching (ALE) process in the absence of a plasma, wherein the etching thins the film on the bottom portion and removes the film from the sidewall and the field area; and
   repeating the depositing and the etching at least once to increase the film thickness on the bottom portion.

2. The method of claim 1, wherein the film includes a metal oxide film.

3. The method of claim 2, wherein the ALE process includes sequential gas exposures of trimethylaluminum (TMA) and HF.

4. The method of claim 2, wherein the metal oxide film is selected from the group consisting of $HfO_2$, $ZrO_2$, $TiO_2$, $Al_2O_3$, and a combination thereof.

5. The method of claim 1, wherein the film is selected from the group consisting of a metal oxide film, a metal nitride film, a metal oxynitride film, a metal silicate film, and a combination thereof.

6. The method of claim 1, further comprising
   following the repeating, overfilling the recessed feature with excess film; and
   removing the excess film from the field area and the overfilled recessed feature in a planarization process.

7. The method of claim 1, wherein the bottom portion and the sidewall contain different materials.

8. The method of claim 7, wherein the different materials are selected from the group consisting of silicon, germanium, silicon germanium, a dielectric material, a metal, and a metal-containing material.

9. The method of claim 7, wherein the depositing has different film nucleation rates on the different materials.

10. The method of claim 1, wherein the bottom portion and the sidewall contain the same material.

11. The method of claim 10, wherein the material is selected from the group consisting of silicon, germanium, silicon germanium, a dielectric material, a metal, and a metal-containing material.

12. The method of claim 1, wherein the film includes a metal film.

13. The method of claim 1, The method of claim 1, wherein the film is selected from the group consisting of Cu, Al, Ta, Ru, TaN, TaC, and TaCN.

14. The method of claim 1, wherein the repeating is performed until recessed feature is fully filled with the film.

15. A substrate processing method, comprising:
   providing a substrate having a recessed feature with a sidewall and a bottom portion;
   depositing a Ru metal film in the recessed feature and on a field area around the opening of the recessed feature, wherein the Ru metal film is non-conformally deposited with a greater film thickness on the bottom portion than on the sidewall and the field area;
   etching the Ru metal film in an atomic layer etching (ALE) process in the absence of a plasma, wherein the etching removes the Ru metal film from the field area; and
   repeating the depositing and the etching until the recessed feature is fully filled with the Ru metal film.

16. The method of claim 15, wherein the bottom portion and the sidewall contain different materials.

17. The method of claim 16, wherein the different materials are selected from the group consisting of silicon, germanium, silicon germanium, a dielectric material, a metal, and a metal-containing material.

18. The method of claim 16, wherein the depositing has different film nucleation rates on the different materials.

19. The method of claim 15, wherein the bottom portion and the sidewall contain the same material.

20. The method of claim 19, wherein the material is selected from the group consisting of silicon, germanium, silicon germanium, a dielectric material, a metal, and a metal-containing material.

* * * * *